(12) United States Patent
Hanabata et al.

(10) Patent No.: US 6,183,935 B1
(45) Date of Patent: Feb. 6, 2001

(54) INORGANIC-CONTAINING PHOTOSENSITIVE RESIN COMPOSITION AND METHOD FOR FORMING INORGANIC PATTERN

(75) Inventors: Makoto Hanabata; Tokugen Yasuda, both of Kyoto (JP)

(73) Assignee: Kansai Research Institute, Osaka (JP)

( * ) Notice: Under 35 U.S.C. 154(b), the term of this patent shall be extended for 0 days.

(21) Appl. No.: 09/380,641

(22) PCT Filed: Dec. 28, 1998

(86) PCT No.: PCT/JP98/05984

§ 371 Date: Sep. 7, 1999

§ 102(e) Date: Sep. 7, 1999

(87) PCT Pub. No.: WO99/35536

PCT Pub. Date: Jul. 15, 1999

(30) Foreign Application Priority Data

Jan. 7, 1998 (JP) .................................................. 10-001252

(51) Int. Cl.⁷ .................................................... G03C 1/492
(52) U.S. Cl. ........................ 430/270.1; 430/281; 430/325
(58) Field of Search ................. 430/270.1, 325, 430/281.1

(56) References Cited

U.S. PATENT DOCUMENTS 4,975,471 * 12/1990 Hayase et al. .......................... 522/13
5,032,490   7/1991  Nebe et al. ........................... 430/281

FOREIGN PATENT DOCUMENTS

| 2177193  | * 1/1987  | (GB) | ................................. C08K/9/06 |
| 53-11952 | 2/1978    | (JP) . |
| 2-005062 | 1/1990    | (JP) . |
| 3-210703 | 9/1991    | (JP) . |
| 5-202146 | 8/1993    | (JP) . |
| 6-019040 | 1/1994    | (JP) . |
| 8-262700 | 10/1996   | (JP) . |
| 9-230587 | 9/1997    | (JP) . |

* cited by examiner

*Primary Examiner*—Janet Baxter
*Assistant Examiner*—Rosemary Ashton
(74) *Attorney, Agent, or Firm*—Pillsbury Madison & Sutro LLP

(57) ABSTRACT

An inorganic pattern is formed by coating an inorganic substance-containing photosensitive composition comprising a photosensitive polymer (A), a condensable organic metal compound or a condensate thereof (B) and an inorganic filler having a functional group (C) on a base, exposing the coated layer, and developing the exposed layer to form a pattern, baking the pattern give an inorganic pattern. The photosensitive polymer (A) may be constituted of an oligomer or polymer, and a photosensitizer, and the condensable organic metal compound (B) may have a photosensitive group. The inorganic filler may be a monodispersed colloidal silica having a mean particle size of 2 to 100 nm. The proportions of the components (B) and (C) relative to 1 part by weight of the component (A) on a solid basis are about 1 to 25 parts by weight and about 1 to 20 parts by weight, respectively. Even when the content of an inorganic component is high, an inorganic pattern of high resolution can be formed with the use of the above resin composition.

20 Claims, No Drawings

INORGANIC-CONTAINING PHOTOSENSITIVE RESIN COMPOSITION AND METHOD FOR FORMING INORGANIC PATTERN This application is the national phase of international application PCT/JP98/05984 filed Dec. 28, 1998 which designated the U.S.

TECHNICAL FIELD

The present invention relates to inorganic substance-containing photosensitive resin compositions useful for forming minute inorganic patterns, a process for producing the same, and a process for forming inorganic patterns.

BACKGROUND ART

As materials for forming inorganic patterns, there have been known photosensitive pastes made up with a photosensitive resin filled with or comprising inorganic particulates. Such photosensitive paste is coated or applied on a substrate (or base), and the coat layer is exposed patternwise through a given mask, developed, and baked or calcinated for eliminating an organic component(s) to form an inorganic pattern. Photosensitive pastes of such type are required to have a high inorganic component content and high sensitivity, and to be able to give high resolution. However, in a photosensitive paste, the concentration of inorganic particulates (filling factor) and photosensitive properties (e.g., sensitivity, resolution) are incompatible with each other. Therefore, when the filling factor of the inorganic particulates is low, upon heat-baking for elimination of organic components, an inorganic pattern largely shrinks or becomes much smaller in volume and is separated from the substrate, resulting in deterioration in adhesion. In addition, the profile of the pattern is deformed and the resolution is consequently deteriorated. On the other hand, when the content of the inorganic particulates is raised, exposed light is absorbed, reflected or scattered by the inorganic particulates and therefore the sensitivity and resolution are reduced. Moreover, it is difficult to form minute inorganic patterns having highly rectangular profiles and high aspect ratios with high precision using the above photosensitive paste.

To improve the dispersibility of inorganic particulates and thereby to improve the sensitivity and resolution, treatment over the surfaces of the inorganic particulates has been proposed. However, the dispersibility has not reached a sufficient level yet and the contrast between the exposed areas and non-exposed areas (the difference between the solubilities thereof to a developer) is low, and such surface treatment is not sufficient as to improve the resolution.

Accordingly, an object of the present invention is to provide a inorganic substance-containing photosensitive resin composition which is highly sensitive and capable of providing an inorganic pattern of high resolution even with a high inorganic component content, a process for producing the same, and a process for forming inorganic patterns.

Another object of the present invention is to provide an inorganic substance-containing photosensitive composition useful for forming an inorganic pattern which shows a sharply defined rectangular profile and has a high aspect ratio, a process for producing the same, and a process for forming inorganic patterns.

DISCLOSURE OF INVENTION

The inventors of the present invention did intensive research and found that the sensitivity of a photosensitive resin composition and the resolution of a pattern formed therefrom, even with a high inorganic component filling factor, can be maintained at high levels by improving the dispersibility of an inorganic component contained therein, and that the dispersibility can be improved by using a photosensitive resin, a condensable (hydrolytic polymerizable) organic metal compound and inorganic particulates having a functional group showing for example reactivity and photosensitivity in combination. The present invention is achieved based on the above findings.

To summarize, the inorganic substance-containing photosensitive resin composition of the present invention comprises (A) a photosensitive organic oligomer or polymer, (B) a condensable (hydrolytic polymerizable) organic metal compound or a condensate thereof, and (C) an inorganic filler having a functional group. The photosensitive organic oligomer or polymer (A) may be constituted of an oligomer or a polymer and a photosensitizer. The condensable organic metal compound (B) may be constituted of a silicon-containing compound or a silane coupling agent having a photosensitive group, or a condensate thereof. The functional group of the above inorganic filler (C) may be a photosensitive group and the inorganic filler (C) may be a monodispersed colloidal silica having a mean particle size of 2 to 100 nm.

The present invention includes a process for producing an inorganic substance-containing photosensitive resin composition which comprises mixing (A) a photosensitive organic oligomer or polymer, (B) a hydrolytic polymerizable organic metal compound or a condensate thereof, and (C) an inorganic filler having a functional group, and a process for forming an inorganic pattern which comprises coating or applying the above-described inorganic substance-containing photosensitive resin composition on a substrate or base, exposing the coated layer, developing the exposed layer to form a pattern, and baking the pattern.

BEST MODE FOR CARRYING OUT THE INVENTION

Photosensitive Polymer

The photosensitive organic oligomer or polymer (A) (hereinafter, referred to simply as a photosensitive polymer) may be constituted of (A1) an oligomer or polymer which itself has photosensitivity, or (A2) a photosensitive resin composition containing an oligomer or polymer and a photosensitizer. The latter, i.e., the photosensitive resin composition (A2) is usually employed.

Examples of (A1) the oligomer or polymer having sensitivity are diazonium salt group-containing polymers, azido group-containing polymers, and polymers having a photodimerizable functional group such as cinnamoyl group or cinnamylidene group (e.g., polyvinyl cinnamates).

As an oligomer or polymer constituting the photosensitive polymer (A2), use can be made of a variety of polymers having a polar or nonpolar group. The preferable photosensitive polymer has a polar group, for example, hydroxyl group, an alkoxy group, carboxyl group, an ester group, an ether group, a carbonate group, amide group or an N-substituted amide group (e.g., —NHC(O)—, >NC(O)—), nitrile group, glycidyl group, or a halogen atom. The photosensitive polymer may be a polymerizable oligomer or polymer having a polymerizable group such as (meth)acryloyl group and allyl group.

Examples of the hydroxyl group-containing polymer and a derivative thereof are polyvinyl alcohol-series polymers, polyvinyl acetals, ethylene-vinylalcohol copolymers, phenolic resins, novolak resins, methylolmelamine, and derivatives thereof (e.g., acetalized polymers or compounds, hexamethoxymethylmelamine). Examples of the carboxyl group-containing polymer and a derivataive thereof are homopolymers and copolymers containing a polymerizable unsaturated carbonic acid such as (meth)acrylic acid, maleic anhydride, and itaconic acid, and esters thereof. Examples of the ester group-containing polymers are homopolymers and copolymers containing a monomer such as a vinyl ester (e.g., vinyl acetate) and a (meth)acrylic acid ester (e.g., methyl methacrylate), (e.g., polyvinyl acetate, ethylene-vinyl acetate copolymer, and (meth)acrylic resins); saturated polyesters; unsaturated polyesters; vinyl ester resins; diallyl phthalate resins; and cellulose esters. As a polymer having an ether group, there may be exemplified polyalkylene oxides, polyoxyalkylene glycols, polyvinyl ethers, and silicone resins. As a carbonate group-containing polymer, there may be exemplified bisphenol A-based polycarbonates.

As the above polymers having an amide group or a substituted amide group, there may be exemplified polyoxazoline or N-acylated polyalkylene imines (polymers corresponding to the above polyoxazoline, such as polymers having an N-acylamino group such as N-acetylamino group and N-polypropionylamino group); poly(vinylpyrrolidone) and derivatives thereof; polyurethane-series polymers; polyureas; nylons or polyamide-series polymers; polymers having a biuret bond; polymers having an allophanate bond; and protein such as gelatin.

As a monomer which constitutes the above polyoxazoline, there may be exemplified 2-oxazoline, 2-substituted-2-oxazolines which has a substituent at 2-position of an oxazoline ring [e.g., oxazolines having a substituent such as $C_{1-4}$ alkyl groups, haloalkyl groups (e.g., dichloromethyl, trichloromethyl, pentafluoroethyl groups), phenyl group, phenyl groups having a substituent (e.g., 4-methylphenyl, 4-chlorophenyl), and $C_{1-4}$ alkoxy-carbonyl groups]. The polyoxazoline may be a homopolymer or copolymer and can be used either singly or in combination. Moreover, the polyoxazoline may be a copolymer in which oxazoline is graft-polymerized on other polymer.

The above polyurethane-series polymers include polyurethanes formed by the reactions of polyisocyanates (e.g., tolylene diisocyanate, hexamethylene diisocyanate, isophorone diusocyanate) with polyols (e.g., polyhydric alcohols such as ethylene glycol, propylene glycol, tetramethylene glycol, and glycerol; polyether polyols such as diethylene glycol, polyethylene glycol, dipropylene glycol, and polypropylene glycol; polyester polyols). The polyureas include polymers formed by the reactions of polyisocyanates with polyamines (e.g., ethylenediamine, diethylenetriamine), and the nylons and polyamide-series polymers include polyamides containing a lactam component, or a dicarbonic acid component and a diamine component (e.g., nylon 66, nylon 6, nylon 610, nylon 611, nylon 612, and modified nylons thereof), poly(meth) acrylamide-series polymers, and polyamino acids. The polyamides include star-burst dendrimer (D. A. Tomalia.et al., Polymer Journal, 17,117 (1985)).

The polymers having a biuret bond include polymers formed by the reaction of the above polyisocyanate with a compound having a urethane bond. The polymers having an allophanate bond include polymers formed by the reaction of the above polyisocyanate with a compound having a urea bond.

The polymers having a nitrile group include acrylonitrile-series polymers. As a polymer having a glycidyl group, there may be exemplified epoxy resins, homo- or copolymers of glycidyl (meth)acrylate. Examples of the halogen-containing polymer are polyvinyl chlorides, vinyl chloride-vinyl acetate copolymers, vinylidene chloride-series polymers, and chlorinated polypropylenes.

Examples of other organic polymers are polyolefinic resins such as polyethylenes, polypropylenes, carboxyl-modified polyolefines; and styrenic resins such as polystyrenes, styrene-acrylonitrile copolymers, acrylonitrile-butadiene-styrene block copolymers. These polymers can be used either singly or in combination.

As a polymerizable oligomer having a polymerizable group, there may be exemplified derivatives of polyvinylphenol; epoxy(meth)acrylates (e.g., resins formed by the reaction of epoxy resins with (meth)acrylic acid); polyester (meth)acrylates; unsaturated polyester resins; polyurethane (meth)acrylates [e.g., the reaction products of a diol component (e.g., polyalkylene glycol, polyester diol), a diisocyanate (e.g., 2,4-tolylenediisocyanate), and a hydroxyl group-containing polymerizablemonomer (e.g., 2-hydroxyethylmethacrylate, N-methyloleacrylamide), the urethane reaction products of a compound having a hydroxyl group and a polymerizable unsaturated group (e.g., hydroxyethylphthalyl (meth)acrylte, trimethylolpropane diallyl ether) with a diusocyanate (e.g., xylylene isocyanate, 2,4-tolylenediisocyanate)]; polymerizable polyvinyl alcohol-series polymers (e.g., the reaction products of polyvinyl alcohols with N-methylolacrylamide); polyamide-series polymers [e.g., prepolymers formed by the reaction of a carboxyl group-containing ester formed by the reaction of a polycarboxylic acid or an anhydride thereof (e.g., pyromellitic acid dianhydride) with a hydroxyl group-containing polymerizable polymer (e.g., allyl alcohol), a diamine (e.g., p,p'-diaminodiphenylether) and, optionally, a halogenating agent for converting a carboxyl group to an acid halide group (e.g., thionyl chloride); the reaction products of a carboxyl group-containing polymer (e.g., copolymers of poly(meth)acrylic acid or maleic acid, ethylene-maleic anhydride copolymers) with amino group-containing polymerizable monomers (e.g., allylamine)]; and silicone resin-type polymers. The preferred oligomer or polymer constituting the (A2) includes urethane (meth)acrylate, etc.

If needed, the photosensitive polymers (A1) and (A2) can be used together with a polymerizable monomer or oligomer having a photopolymerizable group. The polymerizable monomer or oligomer includes monofunctional or polyfunctional photopolymerizable compounds. Examples of the photopolymerizable group contained in a photopolymerizable compound are (meth)acryloyl group, acrylamide group, allyl group, vinylether group, vinylthioether group, vinylamino group, glycidyl group, and acetylenically unsaturated group.

Examples of the monofunctional photopolymerizable compounds are alkyl (meth)acrylates such as (meth)acrylic acid, methyl (meth)acrylate, butyl (meth)acrylate, 2-ethylhexyl (meth)acrylate, and lauryl (meth)acrylate, cyclohexyl (meth)acrylate, benzyl (meth)acrylate, dimethylaminoethyl (meth)acrylate, carbitol (meth)acrylate, 2-hydroxyethyl (meth)acrylate, 2-hydroxypropyl (meth) acrylate, glycidyl (meth)methacrylate, (meth)acrylamide, N-methylol (meth)acrylamide, N-diacetone (meth) acrylamide, N,N'-methylene bis(meth)acrylamide, styrene, (meth)acrylonitrile, vinyl acetate, and N-vinylpyrrolidone.

As a polyfunctional photopolymerizable compound, there may be exemplified ethylene glycol di(meth) acrylate, diethylene glycol di(meth)acrylate, triethylene glycol di(meth) acrylate, polyethylene glycol di(meth)acrylate, polypropylene glycol di(meth)acrylate, 1,4-butanediol di(meth) acrylate, neopentyl glycol di(meth)acrylate, 1,6-hexanediol di(meth)acrylate, pentaerythritol di(meth)acrylate, pentaerythritol tri(meth)acryalte, trimethylolpropane tri(meth)acrylate, and pentaerythritol tetra(meth)acrylate. Further, use can be made of tetramethylolmethane tetra(meth)acrylate, (meth)acrylates of 2,2,5,5-tetrahydroxymethylcyclopentanone, (meth)acrylates of diglycidyl phthalate, (meth)acrylates of N,N,N',N'-tetrakis(β-hydroxyethyl)ethylenediamine, the reaction products of transesterification between triglycerol and methylacrylate, urethane-containing (meth)acrylate, unsaturated esters of polycarboxylic acids, unsaturated acid amides, esters with inorganic acids and metal salts, monomers having an acetylenically unsaturated group, and monomers having a glycidyl group.

As a urethane-containing acrylate, there may be exemplified the reaction products of polyisocyanates (e.g., 2,4-tolylenediisocyanate) with hydroxyl group-containing monomers (e.g., 2-hydroxyethyl methacrylate); the reaction products formed by reacting some of the isocyanate groups of a polyisocyanate (e.g., 2,4-tolylenediisocyanate) with a hydroxyl group-containing monomer (e.g., 2-hydroxyethyl methacryate), followed by reacting the rest of the isocyanate groups with an alkanolamine (e.g., triethanolamine); the reaction products formed by reacting benzoin with polyisocyanates (e.g., 2,4-tolylenediisocyanate) and hydroxyl group-containing monomers (e.g., 2 -hydroxyethyl methacrylate).

Examples of the unsaturated esters of polycarboxylic acids, there may be mentioned polyfunctional monomers formed by estrifying polycarboxylic acids (e.g., phthalic acid, trimellitic acid, pyromellitic acid) with hydroxyl group-containing monomers (e.g., allyl alcohol, 2-hydroxyethyl methacrylate), such as diallyl phthalate, diallyl isophthalate, diallyl malate, diallyl chrolendate, diallyl adipate, diallyl diglycolate, triallyl cyanurate, diethylene glycol bisallyl carbonate, phthalates of 2-hydroxyethyl methacrylate, trimellitic acid esters of allyl alcohol, compounds formed by first estrifying p-hydroxybenzoic acid with (meth)acryloyl chloride and then adding epoxy-containing monomers (glycidyl methacrylate) thereto.

Examples of the unsaturated acid amides are alkylenebisacrylamides such as N,N'-methylenebisacrylamide and hexamethylenebisacrylamide, condensates of polyamines with unsaturated acids, the reaction products of an unsaturated amide having a hydroxyl group (e.g., N-methylolacrylamide) with a polycarboxylic acid or a polyepoxy. Further, there are also exemplified a reaction product of N-metholoacrylamide in the presence of an acidic compound, 1,3,3-trimethyl-1-acryloylaminomethyl-5-acryloylaminocyclohexane, hexahydro-1,3,5-triacryl-S-triazine, N-acryloylhydroxyethylmaleimide, bisacrylamide formed by reacting an oligomer obtained by the reaction of ε-caprolactam with tetramethylenediamine with acrylic acid chloride, N,N'-bis(ε-acryloylhydroxyethyl)aniline, and a reaction product of N-methylolacrylamide with diethylene glycol diglycidyl ether.

As an ester with an iorganic acid or a metal salt, there may be mentioned, for example, zinc acrylate, alcohol-soluble polyamide resins, and bis(2-hydroxyethylmethacrylate) esters of phosphoric acid.

As a monomer having an acetylenically unsaturated group, there may be mentioned, for example, 9-(ω-methoxybutenyl)anthraquinol synthesized from anthraquinone and 1-methoxybuten-2-yne and urethanes formed by reacting 2,4-hexadiyne-1,6-diol with hexylisocyanate.

An example of the monomer having a glycidyl group is bisphenol-A-diglycidyl ether.

The amount of the polymerizable monomer or oligomer having a photopolymerizable group used can be selected from within the range of 5 to 500 parts by weight and preferably about 10 to 300 parts by weight, relative to 100 parts by weight of the above photosensitive polymer.

As the photosensitizer in the photosensitive polymer (A2), use can be made of various photosensitizers and photopolymerization initiators, depending on the type of the photosensitive resin composition used.

The photosensitizer can be selected, according to the type of the photosensitive polymer (positive or negative), from conventional photosensitizers and sensitizers such as diazonium salts (e.g., diazonium salts, tetrazonium salts, polyazonium salts), quionediazides (e.g., diazobenzoquinone derivatives, diazonaphthoquinone derivatives), azide compounds, pyrylium salts, thiapyrylium salts, photopolymerizing sensitizers, photopolymerization initiators [e.g., ketones (e.g., acetophenone, propiophenone, anthraquinone, thioxanthone, benzophenone, and derivatives thereof], benzoin ether and derivatives thereof (e.g., benzoin methyl ether), acylphosphine oxide].

The amount of the photosensitizer used can be selected from within the range of 0.1 to 20 parts by weight and preferably about 1 to 10 parts by weight relative to 100 parts by weight of the photosensitive polymer.

Condensable (Hydrolytic Polymerizable) Organic Metal Compound or Condensates Thereof The condensable organic metal compound or a condensate thereof (B) usually contains an alkaline earth metal, a transition metal, a rare earth metal, or a metal element of the Group III, IV, or V of the Periodic Table of the Elements. Examples of the preferred metallic element are metallic elements of the Groups IIIb, IVa, and IVb, such as aluminium, titanium, zirconium, silicon. Of these, aluminium and silicon (especially, silicon) are particularly preferred. These metals can be contained in the compound or condensate either singly or in combination.

As a condensable (hydrolytic polymerizable) group, there may be exemplified $C_{1-10}$ alkoxy groups such as methoxy, ethoxy, propoxy, isopropoxy, butoxy, isobutoxy, pentyloxy, hexyloxy groups and halogen atoms (e.g., bromine atom, chlorine atom). Of these, $C_{1-4}$ alkoxy groups, particularly methoxygroup, ethoxygroup, and propoxy group (especially, methoxy group and ethoxy group) are preferable. The above compound or condensate may have a single or a plurality of different condensable groups. For condensability or polymerizability, the condensable organic metal compound usually has two or more condensable groups.

Examples of an organic metal compound containing aluminium, there may be mentioned trimethoxy aluminate, triethoxy aluminate, and tripropoxy aluminate. As a compound containing titanium, there may be exemplified trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate. As a compound containing zirconium, there may be mentioned, for example, the zirconates corresponding to the above-mentioned titanium-containing compounds.

The silicon-containing compound includes the compounds shown by the following formula:

$$(R^1)_n Si(OR^2)_{4-n}$$

wherein $R^1$ represents an alkyl having 1 to 4 carbon atoms which may have a substituent, or an aryl group; $R^2$ stands for an alkyl group having 1 to 4 carbon atoms;

$R^1$ and $R^2$ may be the same or different; and n is an integer of 0 to 2.

Examples of the silicon-containing compound are trimethoxysilane, triethoxysilane, tripropoxysilane, tetramethoxysilane, tetraethoxysilane, tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltrimethoxysilane, γ-aminopropyltriethoxysilane, phenyltrimethoxysilane, phenyltriethoxysilane, phenyltripropoxysilane, diphenyldimethoxysilane, and diphenyldiethoxysilane. Of these compounds, the preferred are tetra-$C_{1-4}$alkoxysilanes such as teteramethoxysilane and tetraethoxysilane; mono-$C_{1-4}$alkyltri$C_{1-4}$alkoxysilanes such as methyltrimethoxysilane, ethyltrimethoxysilane, methyltriethoxysilane, and ethyltriethoxysilane; di-$C_{1-4}$alkyldi-$C_{1-4}$alkoxysilanes such as dimethyldiethoxysilane; monoaryltri$C_{1-4}$alkoxysilanes such as phenyltrimethoxysilane and phenyltriethoxysilane; and diaryldi-$C_{1-4}$alkoxysilanes such as diphenyldimethoxysilane and diphenyldiethoxysilane.

It is preferable that the above organic metal compound has a photosensitive group, and examples of the photosensitive group include those exemplified above (e.g., adiazonium salt group, azido group, cinnamoyl group, cinnamylidene group, polymerizable groups), particularly polymerizable groups (e.g., (meth)acryloyl group, allyl group, vinyl group).

As a condensable organic metal compound having a polymerizable group, there may be mentioned, for example, silane compounds having a polymerizable group such as compounds having a (meth)acryloyl group and a hydrolyzable group [e.g., N-(3-(meth)acryloxy-2-hydroxypropyl)-3-aminopropyltriethoxysilane, 3-(meth)acryloxypropyldimethylmethoxysilane, 3-(meth)acryloxypropyldimethylethoxysilane, 3-(meth)acryloxypropylmethyldiethoxysilane, 3-(meth)acryloxypropyltrimethoxysilane, 3-(meth)acryloxypropylmethylbis(trimethylsiloxy)silane, 3-(meth)acryloxypropyltris(trimethylsiloxy)silane, 3-(meth)acryloxypropyltris(methoxyethoxy)silane, 3-(meth)acryloxypropylmethyldichlorosilane, 3-(meth)acryloxypropyltrichlorosilane, 3-(meth)acryloxypropyldimethylchlorosilane, (meth)acryloxypropenyltrimethoxysilane]; compounds having an allyl group and a hydrolyzable group [e.g., allyltrichlorosilane, allyltriethoxysilane, allyltrimethoxysilane, allyltris(trimethylsiloxy)silane]; compounds having a vinyl group and a hydrolyzable group [e.g., vinyldimethylchlorosilane, vinyldimethylethoxysilane, vinylethyldichlorosilane, vinylmethyl-bis(methylethylketoximine)silane, vinylmethyl-bis(trimethylsiloxy)silane, vinylmethyldiacetoxysilane, vinylmethyldichlorosilane, vinylmethyldiethoxysilane, vinyltriacetoxysilane, vinyltrichlorosilane, vinyltrimethoxysilane, vinyltriethoxysilane, vinyltriisopropoxysilane, vinyltris-t-butoxysilane, vinyltrimethylsilane, vinyltriphenoxysilane, vinyltris(t-butylperoxy)silane, vinyltrisisopropenoxysilane, vinyltris(2-methoxyethoxy)silane], KBM 1003 (product name, manufactured by Shinetsu Kagaku Kogyo, Co., Ltd.); KBM1063 (product name, manufactured by Shinetsu Kagaku Kogyo, Co., Ltd.); KBM 1103 (product name, Shinetsu Kagaku Kogyo, Co., Ltd.); KBM 1403 (product name, manufactured by Shinetsu Kagaku Kogyo, Co., Ltd.); KBM 503 (product name, manufactured by Shinetsu Kagaku Kogyo, Co., Ltd.); KBM 502 (product name, manufactured by Shinetsu Kagaku Kogyo, Co., Ltd.); KBM 5103 (product name, manufactured by Shinetsu Kagaku Kogyo, Co., Ltd.); KBM 5102 (product name, manufactured by Shinetsu Kagaku Kogyo, Co., Ltd.); and KBM 5403 (product name, manufactured by Shinetsu Kagaku Kogyo, Co., Ltd.).

The condensable organic metal compound or a condensate thereof can be used either singly or in combination. Moreover, the condensable organic metal compound can be used also as a precondensate. Particularly, a condensable organic metal compound having a photosensitive group (particularly, a polymerizable group) maybe used as a condensate with a non-photosensitive (polymerizable) condensable organic metal compound. For example, as the condensate having a photosensitive group, a condensate obtained by condensing an alkoxysilane compound having a polymerizable group such as (meth)acryloyl group with an alkoxysilane compound can be used. Further, trialkylmonoalkoxysilane may be added to or condensed with the condensable organic metal compound to adjust the crosslinking density, characteristics of the product, etc.

The condensable organic metal compound constitutes an inorganic phase on calcination or baking. For improved storing stability, a protective agent (e.g., alcohols such as t-butanol and isopropanol) may be added to or reacted with (e.g., etherification) the condensable organic compound to protect a hydrolyzable group (e.g., silanol group). Moreover, it is also effective to lower the concentration of an acid or a base as a catalyst for the hydrolysis (e.g., hydrochloric acid, ammonium) by neutralization or through other operations.

Inorganic Filler Having a Functional Group

The inorganic filler having a functional group (C) comprises an inorganic particulate (C1) and a functional group (C2) introduced to the inorganic particulate.

As the inorganic particulate (C1), a variety of particulates are available, depending on the intended functions of the inorganic pattern to be formed. Examples of which are simple substances of metals, inorganic oxides, inorganic carbonates, inorganic sulfates, and phosphates. The inorganic oxides include silica (e.g., colloidal silica, aerogels), alumina, titania, zirconia, zinc oxide, barium titanate, lithium niobate, tin oxide, indium oxide, and $In_2O$—SnO. Examples of the carbonates are calcium carbonate and magnesium carbonate. As the sulfates, there may be mentioned, for example, barium sulfate and calcium sulfate. The phosphates include calcium phosphate and magnesium phosphate.

The configuration of the inorganic particulate is not restricted to sphere and maybe spheroid, disk, rod-like or fibrous. The mean particle size of the inorganic particulate depends on the degree of minuteness of the inorganic pattern to be formed and can be selected from within the range of about 1 nm to 10 μm and preferably about 5 nm to 5 μm. To form a minute inorganic pattern, it is advantageous to use monodispersed inorganic particulates having a mean particle size of 2 to 100 nm (preferably, 5 to 50 nm, more preferably 7 to 30 nm) measured in accordance with the BET method. The monodispersed inorganic particulates (especially, colloidal silica) are commercially available as organosols (organosilicasol) from, e.g., Nissan Kagaku Kogyo, co. Ltd. under the tradename "Snowtex collidatalsilica", particularly "Methanolsilicasol".

It is preferable that the inorganic filler has a reactive group or a photosensitive group (particularly, a polymerizable photosensitive group) as the functional group (C2). Examples of the reactive group or the photosensitive group are the same condensable (hydrolytic polymerizable) groups or photosensitive groups as those exemplified above (particularly, polymerizable groups such as (meth)acryloyl group, allyl group, and vinyl group). The functional group can be introduced to the inorganic particulate (C1) by utilizing a reaction of the inorganic particulate (C1) with an organic metal compound having the condensable group and/or a photosensitive group (particularly, the above-mentioned condensable organic metal compound and among others a silane coupling agent, titanium coupling agent, etc.), surface graft polymerization method, or the CVD method.

As the organic metal compound having a condensable group and/or a photosensitive group, the above-mentioned condensable metal compound or a condensate thereof (B) (particularly, a silicon-containing organic compound) can be used, and the above-exemplified condensable organic metal compounds having a photosensitive group. (particularly, silane compounds having a polymerizable group) are preferable.

In the inorganic filler (C), the amount of the functional group (C2) introduced to the inorganic particulate (C1) can be selected from within the range of, in terms of the compound having a functional group, about 0.1 to 100 parts by weight, preferably about 0.5 to 50 parts by weight, and more preferably about 1 to 20 parts by weight, relative to 100 parts by weight of the inorganic particulates (C1).

Proportions of Components

In the photosensitive resin composition of the present invention, the proportions of the components (A) to (C) can be selected in the ranges not adversely affecting the sensitivity, the resolution, heat resistance, and other characteristics of the inorganic patterns formed therefrom. Usually, on a solid basis, the amount of the component (C) is larger than the total amount of the components (A) and (B) [(A+B)<C]. For example, on a solid basis [excluding the components formed on calcination or baking (e.g., water, alcohols, etc. produced upon condensation), the proportion of (B) the condensable organic metal compound or condensate thereof is 1 to 25 parts by weight (preferably, 2 to 20 parts by weight, more preferably about 5 to 15 parts by weight), and the proportion of (C) the inorganic filler having a functional group is 1 to 20 parts by weight (preferably, 2 to 18 parts by weight, more preferably about 5 to 15 parts by weight), relative to 1 part by weight of (A) the photosensitive organic oligomer or polymer. Particularly, in the composition comprised of the components (A), (B), and (C), the content of the component (C) is, for example, about 50 to 95% by weight and preferably about 50 to 90% by weight.

If necessary, the inorganic substance-containing photosensitive resin composition may contain a photoreaction accelerator (e.g., polymerization accelerator) such as a dialkylaminobenzoic acid or a derivative thereof, triphenylphosphine, and a trialkylphosphine. Moreover, to the composition may be added various additives such as a stabilizer (e.g., antioxidant), a plasticizer, a surfactant, a dissolution accelerator, and a coloring agent (e.g., dyes, pigments). Further, for ease of handling, for example, of coating, the photosensitive resin composition may comprise a solvent (e.g., water, organic solvents such as alcohols, glycols, cellosolves, ketones, esters, ethers, amides, hydrocarbons).

The inorganic substance-containing photosensitive resin composition of the present invention can be prepared in accordance with a conventional method, for example, by mixing the photosensitive polymer (A), the condensable organic metal compound or condensate thereof (B), and the inorganic filler having a functional group (C). The inorganic substance-containing photosensitive resin composition usually contains a solvent (particularly, a hydrophilic solvent such as an alcohol). The components (A) to (C) may be mixed together at the same time or in a suitable order. Practically, the components (A) to (C) are often individually used in the form of solutions or dispersions.

The process for forming patterns of the present invention comprises applying the above-described inorganic substance-containing photosensitive resin composition on a base or substrate to form a photosensitive layer, exposing the layer patternwise and developing the exposed layer to form a given pattern. Thereafter, the pattern is baked or calcinated and there is formed a high resolution inorganic pattern showing a rectangular profile with a high aspect ratio.

The base can suitably be selected from metals, glass, ceramics, plastics, and the like and the choice depends on the characteristics of the inorganic pattern to be formed or the intended use thereof. The base may be a substrate such as a silicon wafer. Further, the surface of the base material may previously treated with, for example, a silane coupling agent selected from those exemplified above (e.g., a condensable (hydrolytic polymerizable) silane coupling agent having a polymerizable group).

The composition can be applied or coated by a conventional coating method such as a spin coating method, a dipping method, and a casting method. If necessary, the coated composition is dried to remove the solvent thereby to form a photosensitive layer. The patternwise exposure can be conducted by irradiating the layer with light or exposing the layer to light through a given mask. As the light for patternwise exposure, use can be made of various lights (e.g., halogen lamps, high pressure mercury lamps, UV lamps, excimer lasers, electron beam, X-ray, and other radiations) depending on the degree of minuteness of the inorganic pattern. Usually, lights of wavelengths of about 100 to 500 nm, especially ultraviolet ray can be employed. The energy for exposure can be selected according to the photosensitive characteristics (e.g., photocurability) of the above inorganic substance-containing photosensitive resin composition, and the exposing time can be selected from within the range of about 0.1 second to 20 minutes.

A high resolution pattern can be formed by developing the photosensitive layer in a conventional manner after the patterwise exposure. Various developers or developing agents (e.g., water, alkaline solutions, organic solvents, and mixtures thereof) are usable and the choice depends on the type of the inorganic substance-containing photosensitive resin composition (particularly, negative or positive). The developing method is not specifically restricted and a paddle (meniscus) method, a dipping method, spraying method, or the like may be employed.

Of all the steps, from the application of the inorganic substance-containing photosensitive resin composition to the pattern forming, in a suitable step, a coated layer or film (photosensitive layer) may be heat-treated at a suitable temperature. For example, if necessary, the coated layer may be heat-treated after being exposed to light. Moreover, the pattern formed by the development may be heat-treated, followed by the baking or calcination step.

The baking or calcination can be carried out at a temperature of, e.g., 300 to 1,000° C. and preferably about 400 to 600° C. The baking can be performed in a suitable atmosphere, for example, in an atmosphere of an inert gas or in an atmosphere of an oxygen-containing gas (e.g., air) and at an ambient pressure or under reduced pressure if necessary, depending on the characteristics of the inorganic pattern. In the baking or calcination, the temperature may be elevated either stepwise or continuously. The baking time is not particularly limited and can be selected from within the range of about 1 to 24 hours, and particularly about 5 to 24 hours. By baking in such manner, there can be formed a minute pattern which is made inorganic, and the adhesion between the base and the inorganic pattern is high.

The inorganic substance-containing photosensitive resin composition (photosensitive resin) of the present invention functions as a photosensitive organic/inorganic hybrid material and has advantages of both organic substances and inorganic substances and therefore useful for forming inorganic patterns excellent in insulation, dielectric property, conductivity, transparency, heat stability, hardness, wear resistance, strength, etc. Furthermore, the inorganic substance-containing photosensitive resin composition of the present invention is of broader applicability and applied to, e.g., insulating parts for electronic devices (e.g., a wall formed on the back substrate of a plasma display panel), printing materials, ultraviolet ray-curable coating compositions, inks, etc.

INDUSTRIAL APPLICABILITY

According to the present invention, inorganic patterns of high sensitivity and high resolution can be formed even with a high inorganic component content. Therefore, the present invention is useful for forming inorganic patterns showing sharply defined rectangular profiles with high aspect ratios.

EXAMPLES

The following examples are intended to describe this invention in further detail and should by no means be interpreted as defining the scope of the invention.

Example 1

1. Preparation of Inorganic Substance-Containing Photosensitive Resin Composition (1) Preparation of a Photosensitive Polymer (Organic Component)

2 g of a nylon copolymer (manufactured by Toray co. Ltd., CM8000) was dissolved in 8 g of methanol at 50° C. and the solution was cooled to room temperature. Then, to the solution were added 0.12 g of benzoin methyl ether and 0.4 g of methylenebisacrylamide and stirred to uniform transparency.

(2) Preparation of a Condensable Organic Metal Compound (Inorganic Component)

10.4 g of tetraethoxysilane, 13.95 g of 3-methacryloxypropyltrimethoxysilane, and 6.3 g of 0.05 N of an aqueous solution of hydrochloric acid were stirred at room temperature for one hour to conduct a hydrolysis.

(3) Preparation of an Oorganic/Inorganic Hybrid Solution 7.11 g of the organic component solution obtained in the step (1) and 12.89 g of the inorganic component solution obtained in the step (2) were mixed together at room temperature to prepare an organic/inorganic hydrid solution.

(4) Preparation of a Dispersion Containing Photosensitive Silica Particulates

To 25 g of silica particulates (manufacture by Nissan Kagaku Kogyo, co. Ltd., methanol silicasol, a mean particle size of 10 to 20 nm, a solid content of 30% by weight) were added 1.275 g of 3-methacryloxypropyltrimethoxysilane and 111 g of methanol and stirred at room temperature for 24 hours to introduce photosensitive groups onto the surfaces of the silica particulates. Thereafter, the methanol content was adjusted such that the solid content of the particulates is 30% by weight.

(5) Carbon 13-NMR Spectrum Measurement of the Photosensitive Silica Particulates For confirmation of that the photosensitive groups are introduced onto the surfaces of the silica particulates, the spectrum of the photosensitive silica particulates in a solid state was measured using a JNM-GSX270 as carbon-13NMR measuring device manufactured by Nippon Denshi, Co., Ltd. The absorption of carbon assigned to the propyl group (10, 16, 24 ppm), methoxy group (50 ppm), methyl group (66 ppm), and carbonyl group (168 ppm) of 3-methacryloxypropyltrimethoxysilane were observed and there was confirmed that the photosensitive groups had been introduced to the surfaces of the silica particulates.

(6) Preparation of Inorganic Substance-Containing Photosensitive Resin Composition (Organic/Inorganic/Photosensitive Silica Particulate Mixed Solution)

20 g of the organic/inorganic hybrid solution prepared in the step (3) was mixed with 25 g of the photosensitive silica particulate-containing dispersion prepared in the step (4) at room temperatures to prepare an inorganic substance-containing photosensitive resin composition (organic/inorganic/photosensitive silica particulate mixed solution).

2. Patterning (1) Pretreatment of the Substrate

To 95 g of an ethanol solution containing 5 g of distilled water was added 2 g of 3-methacryloxypropyltrimethoxysilane and 0.05 g of hydrochloric acid solution (0.05 N) and the mixture was stirred at room temperatures for 30 minutes.

A pyrex glass plate as the substrate was subjected to dip coating at a lifting-up speed of 5.0 mm/sec. The coated substrate was heated to dryness with an oven at 80 ° C. for 15 minutes as pretreatment.

(2) Coating

The inorganic substance-containing photosensitive resin composition prepared in the step 1-(6) was applied on the substrate pretreated in the step (1) using a spin coater (manufactured by Mikasa, Co. Ltd., 1H-DX2-type) at a speed of 500 rpm/20 sec., and then dried. The obtained coated layer was colorless and transparent, showing good film-form ability. The layer thickness measured with an electron microscope was about 10 micron.

(3) Exposure and Development

The coating layer (composite film) formed in the step (2) was subjected to contact-exposure through a test mask with an exposing device provided with an ultrahigh pressure mercury lamp of 250 W (manufactured by Mikasa Co., Ltd., Maskalligner M-2L type) for 5 minutes, followed by a spray development with methanol. Microscopic examination of the developed coating layer showed that the loss of the coating layer assigned to the development was substantially not observed. The resolution of the coating layer was 10 micron.

3. Formation of an Inorganic Layer by Heating and Baking

The developed patterned layer was baked in air with the temperature being elevated from room temperature to 570° C. over 12 hours. After being baked, the infrared ray absorption spectrum of the layer showed substantially no absorption due to the organic components was observed, indicating that the layer was almost completely made inorganic. Moreover, the baked layer was microscopically observed to determine its thickness and the thickness was about 8 micron.

Example 2 and Comparative Example

Except that the proportions of the organic/inorganic hybrid solution prepared in the step 1-(3) and the photosensitive silica particulate-containing dispersion prepared in the step 1-(4) were varied, the coating layer was subjected to patterning followed by baking in the same manner as in Example 1. The results of the Examples 1, 2 and Comparative Example are shown in the following Table.

TABLE

|  | Example 1 | Example 2 | Comp. Example |
|---|---|---|---|
| Organic/inorganic hybrid solution (g) | 20 | 20 | 20 |
| Photosensitive silica-containing dispersion (g) | 25 | 50 | 0 |
| Adhesion between substrate and baked coating layer | good | good | practically delaminated |
| Pattern after being baked | good | good | unobservable |

As obvious from the table, in the Examples, the inorganic patterns showing good rectangular profiles were formed with high adhesion to the substrates and high accuracy as compared with those in comparative example.

What is claimed is:

1. An inorganic substance-containing photosensitive resin composition comprising, on a solid content basis, (A) 1 part by weight of a photosensitive organic oligomer or polymer, (B) 1 to 25 parts by weight of a condensable organic metal compound or a condensate thereof having a photosensitive group, and (C) 1 to 20 parts by weight of an inorganic filler having a photosensitive group wherein the amount of said inorganic filler having a photosensitive group (C) is larger than the total amount of said photosensitive organic oligomer or polymer (A) and said organic metal compound or a condensate thereof (B).

2. An inorganic substance-containing photosensitive resin composition according to claim 1, wherein said photosensitive organic oligomer or polymer (A) comprises an oligomer or polymer and a photosensitizer.

3. An inorganic substance-containing photosensitive resin composition according to claim 1, wherein said photosensitive organic oligomer or polymer (A) comprises an oligomer or polymer, a monofunctional or polyfunctional photopolymerizable compound, and a photosensitizer.

4. An inorganic substance-containing photosensitive resin composition according to claim 1, wherein said organic metal compound (B) is an organic metal compound containing a metallic element selected from the elements of the Groups IIIb, IVa, and IVb of the Periodic Table of the Elements, or a condensate thereof.

5. An inorganic substance-containing photosensitive resin composition according to claim 1, wherein said organic metal compound (B) is an aluminum-containing compound, a silicon-containing compound, or a condensate thereof.

6. An inorganic substance-containing photosensitive resin composition according to claim 1, wherein said organic metal compound (B) is a silicon-containing compound or a condensate thereof.

7. An inorganic substance-containing photosensitive resin composition according to claim 1, wherein said organic metal compound (B) has at least one condensable group selected from the group consisting of $C_{1-10}$ alkoxy groups and halogen atoms.

8. An inorganic substance-containing photosensitive resin composition according to claim 1, wherein said organic metal compound (B) has not less than two condensable groups.

9. An inorganic substance-containing photosensitive resin composition according to claim 1, wherein said photosensitive group in (B) is at least one polymerizable group selected from the group consisting of (meth)acryloyl group, allyl group, and vinyl group.

10. An inorganic substance-containing photosensitive resin composition according to claim 1, wherein said organic metal compound (B) is a silane coupling agent or a condensate thereof.

11. An inorganic substance-containing photosensitive resin composition according to claim 1, wherein said inorganic filler having a photosensitive group (C) comprises inorganic particulates (C1) and photosensitive groups (C2) introduced to the inorganic particulates.

12. An inorganic substance-containing photosensitive resin composition according to claim 11, wherein the mean particle size of said inorganic particulate (C1) is 1 nm to 10 $\mu$m.

13. An inorganic substance-containing photosensitive resin composition according to claim 11, wherein said inorganic particulate (C1) is a monodispersed colloidal silica having a mean particle size of 2 to 100 nm.

14. An inorganic substance-containing photosensitive resin composition according to claim 11, wherein said inorganic particulate (C1) is a monodispersed colloidal silica having a mean particle size of 5 nm to 50 nm and said photosensitive group (C2) is at least one polymerizable group selected from the group consisting of (meth)acryloyl group, allyl group, and vinyl group.

15. An inorganic substance-containing photosensitive resin composition according to claim 11, wherein the amount of said photosensitive group (C2) introduced to the inorganic particulate (C1) is 0.1 to 100 parts by weight relative to 100 parts by weight of the inorganic particulate (C1) in terms of the compound having a photosensitive group.

16. An inorganic substance-containing photosensitive resin composition according to claim 1, wherein the content of said component (C) is from about 50 to 95% by weight relative to the total amount of said photosensitive organic oligomer or polymer (A), said organic metal compound or a condensate thereof (B), and said inorganic filler having photosensitive groups (C).

17. An inorganic substance-containing photosensitive resin composition according to claim 1, wherein said photosensitive organic oligomer or polymer (A) comprises an oligomer or polymer and a photosensitizer; said condensable organic metal compound or a condensate thereof (B) is a silane coupling agent having at least two condensable groups selected from the group consisting of $C_{1-4}$ alkoxy groups and halogen atoms, and at least two polymerizable groups, or a condensate thereof; said inorganic filler having a photosensitive group (C) is a monodispersed colloidal silica having a (meth)acryloyl group and a mean particle size of 7 nm to 30 nm; and the amount of the (meth)acryloyl functional group introduced to the colloidal silica is, on the compound having a functional group basis, 0.5 to 50 parts by weight relative to 100 parts by weight of the inorganic particulate (C1).

18. An inorganic substance-containing photosensitive resin composition according to claim 17, which comprises, on a solid basis, 2 to 20 parts by weight of said organic metal compound or a condensate thereof (B) and 5 to 15 parts by weight of said inorganic filler having a photosensitive group (C), relative to 1 part by weight of said photosensitive organic oligomer or polymer (A).

19. A process for production an inorganic substance-containing photosensitive resin composition, which comprises mixing, on a solid content basis, (A) 1 part by weight of a photosensitive organic oligomer or polymer, (B) 1 to 25 parts by weight of a condensable organic metal compound or a condensate thereof having a photosensitive group, and (C) 1 to 20 parts by weight of an inorganic filler having a photosensitive group wherein the amount of said inorganic filler having a photosensitive group (C) is larger than the total amount of said photosensitive organic oligomer or polymer (A) and said organic metal compound or a condensate thereof (B).

20. A process for forming inorganic patterns, which comprises applying an inorganic substance-containing photosensitive resin composition recited in claim 1 onto a base, exposing the coated layer, developing the exposed layer to form a pattern, and baking the pattern.

* * * * *